(12) United States Patent
Lee

(10) Patent No.: US 9,570,701 B2
(45) Date of Patent: Feb. 14, 2017

(54) ORGANIC LIGHT EMITTING DEVICE

(71) Applicant: LG Display Co., Ltd., Seoul (KR)

(72) Inventor: Se-Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/671,002

(22) Filed: Mar. 27, 2015

(65) Prior Publication Data

US 2015/0280160 A1  Oct. 1, 2015

(30) Foreign Application Priority Data

Mar. 28, 2014 (KR) ........................ 10-2014-0036724

(51) Int. Cl.
  H01L 51/00  (2006.01)
  H01L 51/52  (2006.01)
  H01L 51/50  (2006.01)
  H01L 27/32  (2006.01)

(52) U.S. Cl.
  CPC ....... H01L 51/5234 (2013.01); H01L 27/3211 (2013.01); H01L 51/5016 (2013.01); H01L 51/5036 (2013.01); H01L 51/5262 (2013.01); H01L 51/5265 (2013.01); *H01L 51/5218* (2013.01); *H01L 2251/5315* (2013.01)

(58) Field of Classification Search
  CPC ............... H01L 51/504; H01L 51/5016; H01L 51/5218; H01L 51/5234; H01L 27/3211; H01L 51/5266; H01L 51/5262
  See application file for complete search history.

(56) References Cited

U.S. PATENT DOCUMENTS

| | | | | |
|---|---|---|---|---|
| 8,574,725 | B2* | 11/2013 | Nishimura | C09K 11/06 252/301.16 |
| 8,963,127 | B2* | 2/2015 | Pieh | H01L 51/5036 257/40 |
| 9,082,995 | B2* | 7/2015 | Nishimura | C09K 11/06 |
| 2004/0178720 | A1* | 9/2004 | Lee | C09K 11/06 313/504 |
| 2008/0164812 | A1* | 7/2008 | Tsai | H01L 51/5262 313/509 |
| 2014/0353607 | A1* | 12/2014 | Kim | H01L 27/326 257/40 |

\* cited by examiner

*Primary Examiner* — Nicholas Tobergte
(74) *Attorney, Agent, or Firm* — Fenwick & West LLP

(57) ABSTRACT

Disclosed is an organic light emitting device which facilitates to realize a long lifespan and to satisfy a color region, wherein the organic light emitting device may include an organic emitting layer including red, green and blue emitting layers, the organic emitting layer provided between first and second electrodes; and a plurality of dopants included in at least any one of the red, green and blue emitting layers, wherein a maximum intrinsic luminescence wavelength of any one dopant among the plurality of dopants is different from a maximum intrinsic luminescence wavelength of another dopant among the plurality of dopants.

18 Claims, 9 Drawing Sheets

FIG. 5

| Division | Structure | Volt | mA/cm² | cd/A | lm/W | CIE X | CIE Y | EQE(%) | Measured luminance |
|---|---|---|---|---|---|---|---|---|---|
| Comparative example 1 | doped with 10% of first dopant (single dopant) | 3.9 | 3.9 | 113.7 | 92.4 | 0.196 | 0.738 | 32.0 | 7907 |
| Comparative example 2 | doped with 10% of second dopant (single dopant) | 4.0 | 4.0 | 115.6 | 91.4 | 0.265 | 0.705 | 29.7 | 8437 |
| Embodiment 1 | Doped with 10% of mixed dopant of first dopant and second dopant at a ratio of 1 to 1 (mixed dopant) | 3.8 | 3.8 | 123.0 | 101.1 | 0.261 | 0.709 | 31.5 | 8393 |
| Embodiment 2 | Doped with 10% of mixed dopant of first dopant and second dopant at a ratio of 3 to 2 (mixed dopant) | 3.9 | 3.9 | 113.4 | 92.1 | 0.250 | 0.715 | 29.5 | 8305 |
| Embodiment 3 | Doped with 10% of mixed dopant of first dopant and second dopant at a ratio of 4 to 1 (mixed dopant) | 3.9 | 3.9 | 109.5 | 88.8 | 0.234 | 0.722 | 29.2 | 8182 |

ORGANIC LIGHT EMITTING DEVICE

CROSS REFERENCE TO RELATED APPLICATION

This application claims priority to Republic of Korea Patent Application No. 10-2014-0036724 filed on Mar. 28, 2014, which is incorporated herein by reference in its entirety.

BACKGROUND

Field of the Disclosure

Embodiments of the present invention relate to an organic light emitting device, and more particularly, to an organic light emitting device which facilitates to realize a long lifespan and to satisfy a color region.

Discussion of the Related Art

An organic light emitting device, which emits light in itself, is provided in such a structure in which a light emitting layer is formed between a cathode for injecting electrons and an anode for injecting holes. When the electrons generated in the cathode and the holes generated in the anode are injected into the light emitting layer, excitons are produced by the electron and hole bond. Then, when the exciton falls to a ground state from an excited state, the organic light emitting device emits light.

According to a direction of light emitted from the device, the organic light emitting device may be classified into a top emission type, a bottom emission type and a dual emission type. According to a driving method, the organic light emitting device may be classified into a passive matrix type and an active matrix type.

Unlike a liquid crystal display (LCD) device which requires an additional light source, an additional light source is not required for the organic light emitting device, whereby it is possible to manufacture the organic light emitting device to have a thin profile with lightness. Also, the organic light emitting device is driven by a low voltage so that the organic light emitting device is advantageous in an aspect of power consumption. In addition, the organic light emitting device enables great color reproduction, rapid response speed, wide viewing angle, and good contrast ratio (CR), and the organic light emitting device has attracted great attention as a next generation device.

With the advancement of high-resolution displays, the number of pixels for each unit area has increased, and a requirement for high luminance is increasing. However, there is a limitation of luminance (Cd) in each unit area (A) due to the emission structure of the organic light emitting device. Also, the increase of current applied to the organic light emitting device may cause problems such as the lowering of reliability and the increase of power consumption.

Accordingly, it is needed to overcome technical limitations in emitting efficiency, lifespan and power consumption that cause deterioration of quality and lowering of yield in the organic light emitting device. Furthermore, there are continuous studies for developing the organic light emitting device which enables to maintain great color realization, high emitting efficiency, long lifespan and wide viewing angle.

The organic light emitting device according to the related art has limitations of emitting efficiency and lifespan due to the emitting material for the organic emitting layer and the emission structure. Accordingly, various methods for improving the emitting efficiency and lifespan of the organic light emitting device have been proposed. However, when trying to improve the luminance, the power consumption is increased. Meanwhile, if changing the emitting material for improving the lifespan, the emission efficiency of the organic light emitting device is shortened.

If changing the emitting material of red, green and blue emitting layers so as to improve the emitting efficiency, the properties of color region and viewing angle do not meet a required standard.

The organic light emitting device of top emission type may obtain a desired color with high efficiency by amplifying light at a constant thickness of internal resonance by the use of a micro-cavity structure. However, even though it enables the high efficiency, it may have a high level of dependence on emitting dopant, and an intrinsic property of dopant may cause the change of luminescence-span (luminescence lifespan). Accordingly, a new structure for enabling the long lifespan of the organic emitting layer in the organic light emitting device has been studied.

SUMMARY

Accordingly, embodiments of the present invention are directed to an organic light emitting device that substantially obviates one or more problems due to limitations and disadvantages of the related art.

An aspect of embodiments of the present invention is directed to provide an organic light emitting device which facilitates to realize a long lifespan and to satisfy a color region.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

To achieve these and other advantages and in accordance with the purpose of embodiments of the invention, as embodied and broadly described herein, there is provided an organic light emitting device that may include an organic emitting layer including red, green and blue emitting layers, where the organic emitting layer is provided between first and second electrodes; and a plurality of dopants included in at least any one of the red, green and blue emitting layers, wherein a maximum intrinsic luminescence wavelength of any one dopant among the plurality of dopants is different from a maximum intrinsic luminescence wavelength of another dopant among the plurality of dopants.

At this time, the plurality of dopants may include a first dopant and a second dopant. The first dopant and the second dopant, wherein a difference of maximum intrinsic luminescence wavelength between the two dopants is 25 nm or less than 25 nm, may be included in at least any one organic emitting layer, and an energy transfer may be dividedly induced to the first dopant and the second dopant for the luminescence of the organic emitting layer.

Also, the first dopant and the second dopant may include dopant of a phosphorescent material. Also, a maximum luminescence wavelength of the organic emitting layer including the first dopant and the second dopant may have a value between the maximum intrinsic luminescence wavelength of the first dopant and the maximum intrinsic luminescence wavelength of the second dopant.

It is to be understood that both the foregoing general description and the following detailed description of embodiments of the present invention are exemplary and explanatory and are intended to provide further explanation of the invention as claimed.

BRIEF DESCRIPTION OF THE DRAWINGS

The accompanying drawings, which are included to provide a further understanding of embodiments of the invention and are incorporated in and constitute a part of this application, illustrate embodiment(s) of the invention and together with the description serve to explain the principle of embodiments of the invention. In the drawings:

FIG. 5 shows electro-optical characteristics test results in accordance with the condition of single dopant and mixed dopant according to the embodiment of the present invention;

DETAILED DESCRIPTION OF THE INVENTION

Figure 1:
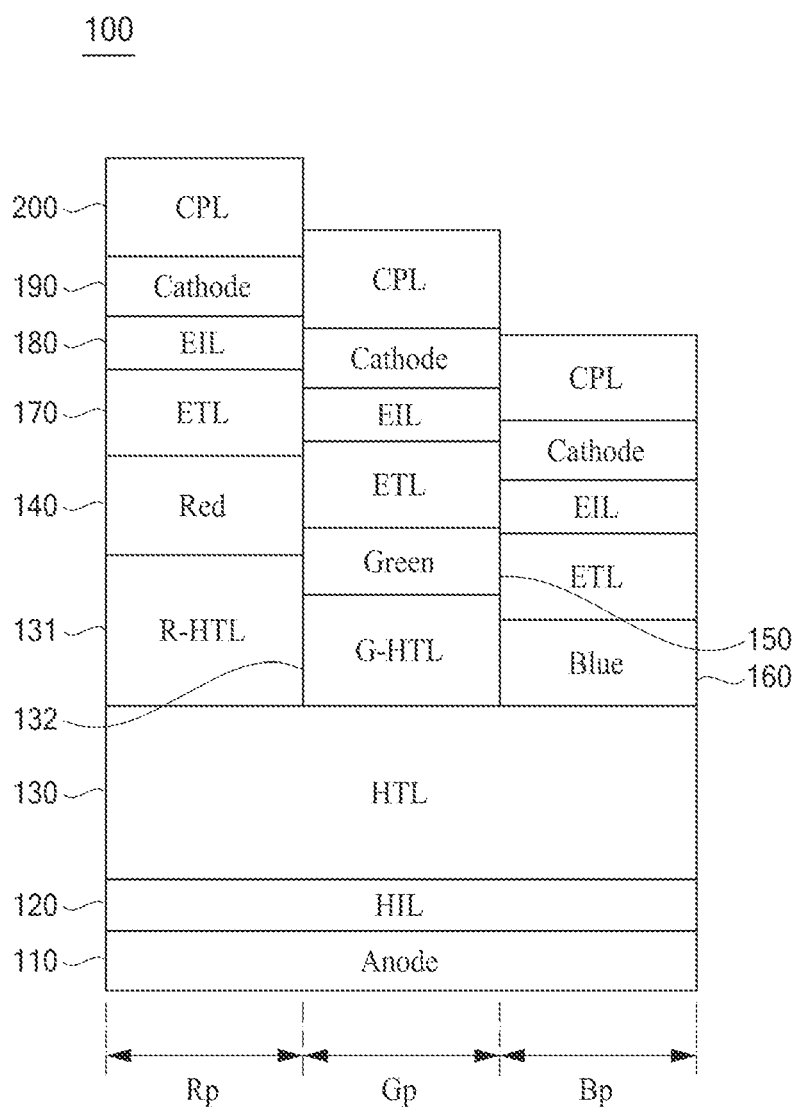
FIG. 1 is a cross sectional view illustrating an organic light emitting device according to the embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary. In construing an element, the element is construed as including an error region although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, an organic light emitting device according to embodiments of the present invention will be described in detail with reference to the accompanying drawings.

FIG. 1 is a cross sectional view illustrating an organic light emitting device according to the embodiment of the present invention.

As shown in FIG. 1, the organic light emitting device 100 according to the embodiment of the present invention includes a first electrode (anode) 110, a hole injection layer (HIL) 120, a first hole transporting layer (HTL) 130, a second hole transporting layer (R-hole transporting layer, R-HTL) 131, a third hole transporting layer (G-hole transporting layer, G-HTL) 132, an organic emitting layer comprising of a red emitting layer (Red) 140, a green emitting layer (Green) 150 and a blue emitting layer (Blue) 160, an electron transporting layer (ETL) 170, an electron injection layer (EIL) 180, a second electrode (cathode) 190, and a capping layer (CPL) 200, wherein the above elements 110 to 200 are deposited on a substrate defined with red (Rp), green (Gp) and blue (Bp) pixel regions.

In the organic light emitting device including an organic light emitting diode, which is not shown, there are gate lines crossing each other to define each pixel region on the substrate, a power line extending in parallel to any one of the gate and data lines, a switching thin film transistor provided in each pixel region and electrically connected with the gate and data lines, and a driving thin film transistor electrically connected with the switching thin film transistor. The driving thin film transistor is connected with the first electrode (anode) 110.

The first electrode 110 is formed in the red, green and blue pixel regions, and the first electrode 110 may be formed of a reflective electrode. For example, the reflective electrode may include a transparent conductive material layer with a high work function such as Indium-Tin-Oxide (ITO), and a reflective material layer such as argentum (Ag) or argentum alloy (Ag alloy).

The hole injection layer (HIL) 120 and the first hole transporting layer (HTL) 130 are provided on the first electrode 110 above the red (Rp), green (Gp) and blue (Bp) pixel regions.

The hole injection layer (HIL) 120 enables a smooth injection of hole. The hole injection layer (HIL) 120 may be selected from at least any one of groups of HATCN and CuPc(cupper phthalocyanine), PEDOT(poly(3,4)-ethylene-dioxythiophene), PANI(polyaniline), and NPD(N,N-dinaphthyl-N,N'-diphenylbenzidine), but not limited to these materials.

The first hole transporting layer (HTL) 130 may be referred to as a common hole transporting layer. The second hole transporting layer (R-HTL) 131 and the third hole transporting layer (G-HTL) 132 are provided on the first hole transporting layer (HTL) 130, wherein the second hole transporting layer (R-HTL) 131 is disposed above the red pixel region (Rp), and the third hole transporting layer (G-HTL) 132 is disposed above the green pixel region (Gp).

The first, second and third hole transporting layers (HTL, R-HTL, G-HTL) 130, 131 and 132 enable a smooth transport of hole. The first, second and third hole transporting layers (HTL, R-HTL, G-HTL) 130, 131 and 132 may be selected from at least any one of groups of NPD(N,N-dinaphthyl-N,N'-diphenylbenzidine), TPD(N,N'-bis-(3-methylphenyl)-N,N'-bis-(phenyl)-benzidine), s-TAD, and MTDATA(4,4',4"-Tris(N-3-methylphenyl-N-phenyl-amino)-triphenylamine), but not limited to these materials.

The red emitting layer (Red) 140, green emitting layer (Green) 150 and blue emitting layer (Blue) 160 are respectively provided in the red pixel region (Rp), green pixel region (Gp) and blue pixel region (Bp). Also, the red emitting layer (Red) 140 may include a red emitting material, the green emitting layer (Green) 150 may include a green emitting material, and the blue emitting layer (Blue) 160 may include a blue emitting material. These emitting materials included in the respective emitting layers may be phosphorescent materials or fluorescent materials.

The red emitting layer (Red) 140 may comprise a host material of CBP(carbazole biphenyl) or mCP(1,3-bis(carbazol-9-yl). The red emitting layer (Red) 140 may be formed of a phosphorescent material with dopant including at least any one selected from a group consisting of PIQIr(acac)(bis (1-phenylisoquinoline) acetylacetonate iridium), PQIr(acac) (bis(1-phenylquinoline) acetylacetonate iridium), PQIr(tris (1-phenylquinoline) iridium), and PtOEP (octaethylporphyrin platinum), or may be formed of a fluorescent material including PBD:Eu(DBM)3(Phen) or Perylene, but not limited to these materials.

The green emitting layer (Green) 150 may comprise a host material of CBP or mCP. The green emitting layer (Green) 150 may be formed of a phosphorescent material with a dopant material such as Ir complex including Ir(ppy) 3(fac tris(2-phenylpyridine)iridium), or may be formed of a fluorescent material including Alq3(tris(8-hydroxyquinolino)aluminum), but not limited to these materials.

The blue emitting layer (Blue) 160 may comprise a host material of CBP or mCP. The blue emitting layer (Blue) 160 may be formed of a phosphorescent material with a dopant material including (4,6-F2ppy)2Irpic, or may be formed of a fluorescent material including at least any one selected from groups of spiro-DPVBi, spiro-6P, distilbenzene(DSB), distrilarylene(DSA), PFO-based polymer, and PPV-based polymer, but not limited to these materials.

The electron transporting layer (ETL) 170 is provided on the red emitting layer 140, green emitting layer 150 and blue emitting layer 160. The thickness of the electron transporting layer 170 is adjusted in consideration of the electron transporting properties. The electron injection layer 180 may be additionally provided on the electron transporting layer (ETL) 170.

The electron transporting layer (ETL) 170 enables a smooth transport of electron. The electron transporting layer (ETL) 170 may be selected from at least any one of groups of Alq3(tris(8-hydroxyquinolino)[0046] aluminum), PBD, TAZ, spiro-PBD, BAlq, and SAlp, but not limited to these materials.

The electron injection layer (EIL) 180 may be formed of Alq3(tris(8-hydroxyquinolino)aluminum), PBD, TAZ, spiro-PBD, BAlq, or SAlq, but not limited to these materials.

The organic light emitting device according to the embodiment of the present invention is not limited to the above structure. For example, it is possible to remove at least any one of the hole injection layer (HIL) 120, the first, second and third hole transporting layers (HTL, R-HTL, G-HTL) 130, 131 and 132, the electron transporting layer (ETL) 170 and the electron injection layer (EIL) 180. Also, at least any one of the hole injection layer (HIL) 120, the first, second and third hole transporting layers (HTL, R-HTL, G-HTL) 130, 131 and 132, the electron transporting layer (ETL) 170 and the electron injection layer (EIL) 180 may be formed of two or more layers.

The second electrode 190 is provided on the electron injection layer (EIL) 180. For example, the second electrode 190 may be formed of an alloy (Mg:Ag) of magnesium and argentum, whereby the second electrode 190 may have the semi-transmissive (transflective) properties. That is, when light emitted from the organic emitting layer is displayed through the second electrode 190, some of the light is reflected toward the first electrode 110 due to the semi-transmissive properties of the second electrode 190.

Thus, a repetitive reflection occurs between the first and second electrodes 110 and 190, which is referred to as a micro-cavity effect. That is, light is repetitively reflected in a cavity between the first and second electrodes 110 and 190, resulting in an improvement in emitting efficiency.

Also, it is possible to provide the first electrode 110 of a transmitting electrode, and the second electrode 190 of a reflective electrode. That is, light emitted from the organic emitting layer is displayed through the first electrode 110.

The capping layer (CPL) 200 is provided to improve light extraction efficiency. The capping layer (CPL) 200 may be formed of any one of the materials for the hole transporting layers 130, 131 and 132, the material for electron transporting layer 170 and the host materials for the red, green and blue emitting layers 140, 150 and 160. It is possible to omit the capping layer (CPL) 200.

Figure 2A:
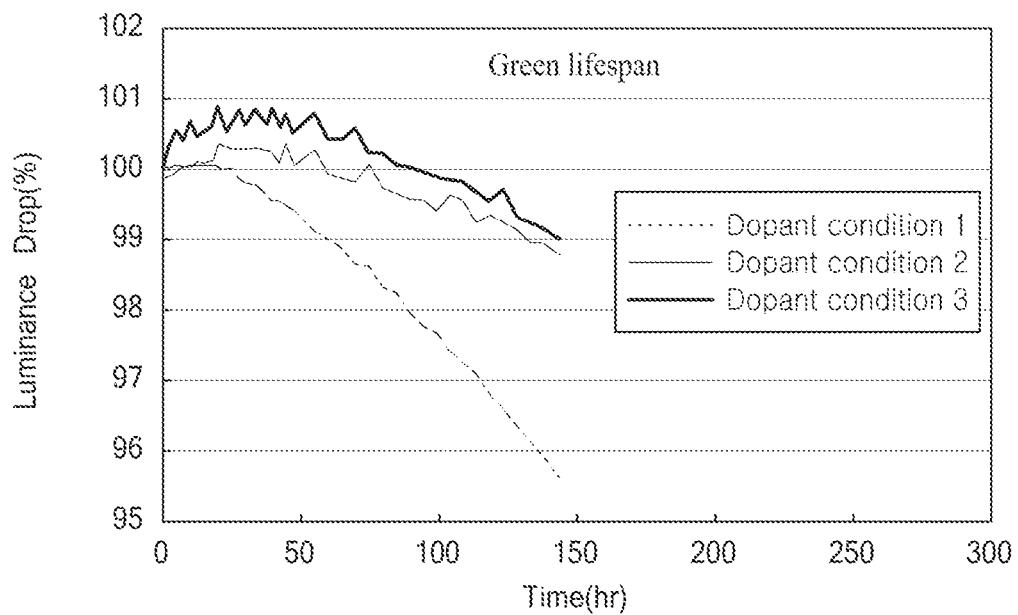
FIG. 2A shows a test result of green luminescence-span of the organic light emitting device according to the embodiment of the present invention.
Figure 2B:
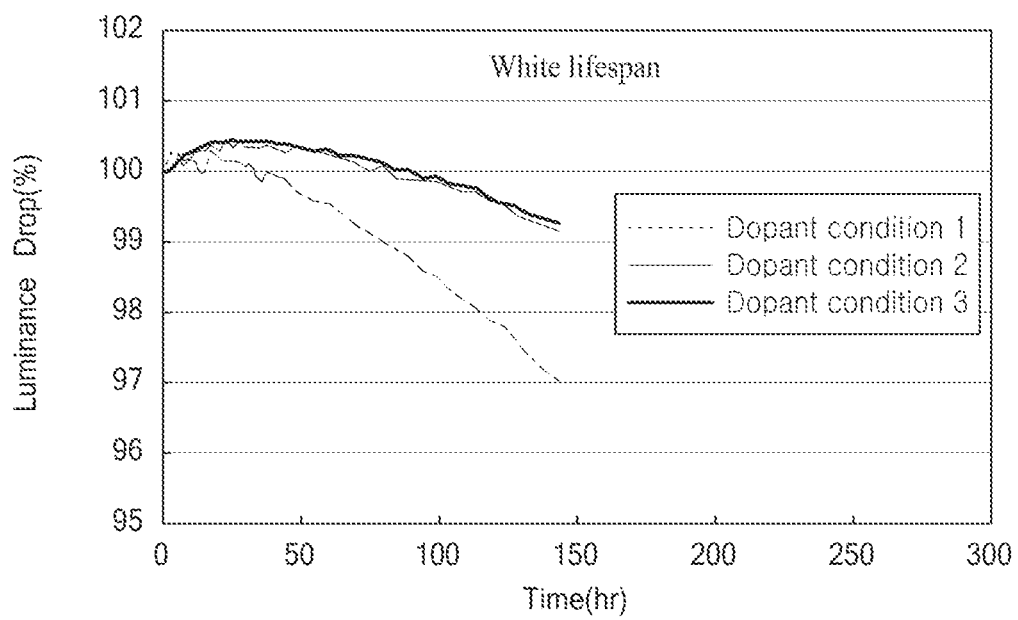
FIG. 2B shows a test result of white luminescence-span of the organic light emitting device according to the embodiment of the present invention.

FIGS. 2A and 2B show luminescence-span test results of green luminescence-span and white luminescence-span in the organic light emitting device. In case of the luminance ratio of red, green and blue pixel regions for the white chromaticity coordinates of organic light emitting panel, the green pixel region occupies 70% or more. This is because the green pixel region is optically most visible to human eyes. Thus, the green pixel region has the highest luminance rate.

In FIGS. 2A and 2B, dopant condition 1, dopant condition 2 and dopant condition 3 respectively show lifespan measurement results of green luminescence and white luminescence when the dopant condition is differently applied to the organic emitting layer of the organic light emitting device.

According to the luminescence-span test results of FIGS. 2A and 2B, the white luminescence-span is changed in accordance with the green luminescence-span. In case of dopant condition 2 and dopant condition 3 of FIGS. 2A and 2B, the lifespan of white luminescence is long owing to the long lifespan of green luminescence. However, in case of dopant condition 1, the lifespan of white luminescence is short due to the short lifespan of green luminescence.

That is, as shown in FIGS. 2A and 2B, in case of the organic light emitting device with the same structure under the different applications of the dopant condition, the lifespan of white luminescence depends on the lifespan of green luminescence. Thus, the lifespan of white luminescence, that is, the lifespan of organic light emitting device may be enhanced by improving the lifespan of green luminescence in the organic light emitting device.

Figure 3:
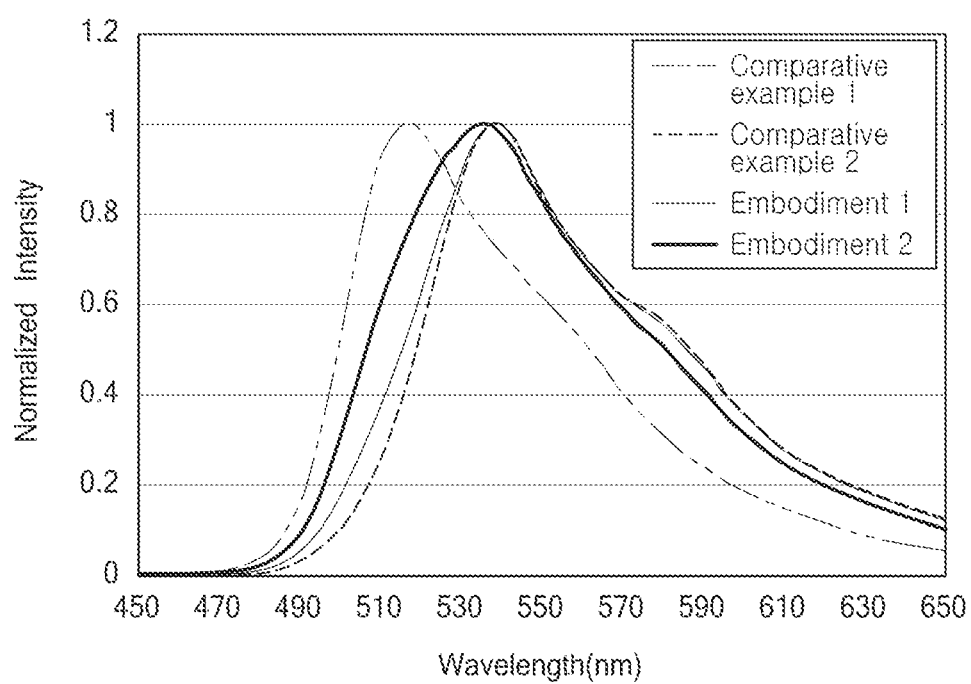
FIG. 3 shows a test result of a maximum intrinsic luminescence wavelength of dopant when a single dopant or mixed dopant is selectively applied to the organic light emitting device.

FIG. 3 shows a test result of a maximum intrinsic luminescence wavelength of dopant when a single dopant or mixed dopant is selectively applied to the organic light emitting device.

In comparative examples 1 and 2 of FIG. 3, a host material for measuring a maximum intrinsic luminescence wavelength of each of the first dopant and the second dopant is formed of CBP, and a thin film having a thickness of 1000 Å is used. The first dopant and second dopant are formed of iridium complex (Ir complex), and the different kinds of dopants whose maximum intrinsic luminescence wavelengths are different from each other due to use of different ligands. In case of the comparative example 1, the host of CBP with 1000 Å thickness is doped with 10% of the first dopant. In case of the comparative example 2, the host of CBP with 1000 Å thickness is doped with 10% of the second dopant.

In the embodiments 1 and 2 of FIG. 3, a thin film with 1000 Å thickness is formed by the use of host material of CBP in accordance with the same method of the comparative examples 1 and 2 shown in FIG. 3, and then the host is doped with 10% of first dopant and second dopant at a ratio of 1 to 1 and at a ratio of 4 to 1. After that, a ultraviolet (UV) region of a wavelength of 350 nm is applied to each of the comparative examples 1 and 2 and the embodiments 1 and 2 by the use of PL measurement system for measuring the maximum intrinsic luminescence wavelength, to thereby measure a photo luminescence (PL) wavelength.

In this case, the PL wavelength is a spectrum obtained by analyzing light emitted from the emitting layer, that is, a spectrum having intrinsic properties in accordance with properties of dopant doped onto the emitting layer, and more particularly, in accordance with intrinsic properties and doping concentration of dopant.

As shown in FIG. 3 showing the test results of maximum intrinsic luminescence wavelength on the application of single dopant and mixed dopant, a luminescence region shown in the maximum intrinsic luminescence wavelengths of the embodiments 1 and 2 is relatively larger than a luminescence region shown in the maximum intrinsic luminescence wavelengths of the comparative examples 1 and 2. In case of the embodiment 1, an energy transfer occurs in accordance with the doping concentration, whereby the light is emitted in a short wavelength region.

In case of the embodiment 2, a doping concentration of the first dopant with the maximum intrinsic luminescence wavelength of a short wavelength is higher than a doping concentration of the second dopant with the maximum intrinsic luminescence wavelength of a long wavelength, whereby an energy is easily transferred to the first dopant, and thus a luminescence region becomes wide owing to the luminescence in both first dopant and second dopant.

The test results for measurement of the maximum intrinsic luminescence wavelength in the comparative examples 1 and 2 and the embodiments 1 and 2 on the application of single dopant and mixed dopant will be shown in the following Table 1.

TABLE 1

|  | PL max wavelength (nm) |
| --- | --- |
| Comparative example 1 | 516 |
| Comparative example 2 | 538 |
| Embodiment 1 | 538 |
| Embodiment 2 | 534 |

In the above Table 1, the maximum intrinsic luminescence wavelength of comparative example 1 is 516 nm, and the maximum intrinsic luminescence wavelength of comparative example 2 is 538 nm. A difference of the maximum intrinsic luminescence wavelength between the comparative example 1 and the comparative example 2, that is, a difference of the maximum intrinsic luminescence wavelength between the first dopant and the second dopant is 22 nm.

As shown in Table 1, the maximum intrinsic luminescence wavelengths of the embodiments 1 and 2 applied with the mixed dopant of first dopant and second dopant are respectively 538 nm and 534 nm. The maximum intrinsic luminescence wavelengths of the embodiments 1 and 2 are within the region of 516 nm, corresponding to the maximum intrinsic luminescence wavelength of the comparative example 1 applied with only the first dopant, and 538 nm, corresponding to the maximum intrinsic luminescence wavelength of the comparative example 2 applied with only the second dopant.

In consideration of an error region of 10%, it is preferable to mix the two dopants wherein the difference of maximum intrinsic luminescence wavelength between the two dopants is 25 nm or lower than 25 nm, to thereby realize a luminescence wavelength of a desired color region.

Figure 4:
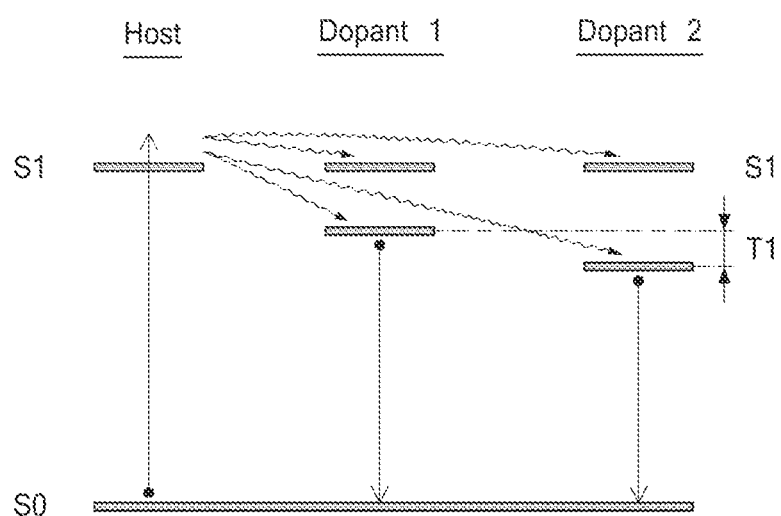
FIG. 4 illustrates an energy transfer mechanism of two dopants on the luminescence of the organic light emitting device according to the embodiment of the present invention.

FIG. 4 illustrates an energy transfer mechanism to the two dopants on the luminescence of the organic light emitting device according to the embodiment of the present invention.

The luminescence is an emission of light with a particular wavelength when a substance is excited by energy of electromagnetic wave, heat or friction. When an emitting material of emitting layer becomes an excited state (S1) by energy occurring with a bond of electron and hole, and the excited state (S1) falls to a ground state (S0), the light is produced. A luminescence when a singlet energy level (S1), that is, excited state (S1) becomes to the ground state (S0) is referred to as fluorescence. Also, a luminescence when the singlet energy level (S1) becomes to the ground state (S0) via a relatively-low triplet energy level (T1) is referred to as phosphorescence.

The following case shows an organic emitting layer doped with the mixture of first dopant and second dopant. When the difference of maximum intrinsic luminescence wavelength of first dopant and second dopant is large, the energy transfer is induced from the dopant with short wavelength to the dopant with long wavelength. Accordingly, the light of dopant with long wavelength is emitted, whereby only the light with long wavelength is amplified, and the light of dopant with short wavelength is not emitted. That is, it is difficult to satisfy a desired color region.

However, as shown in FIG. 4, when the two dopants, wherein the difference of maximum intrinsic luminescence wavelength between the two dopants is 25 nm or less than 25 nm, are applied to one organic emitting layer, the energy transfer is dividedly induced to the first dopant and the second dopant. That is, when the organic emitting layer emits light, the energy transfer is divided into the first dopant and the second dopant, whereby an energy transfer stress is divided and applied to each of the first dopant and the second dopant. Accordingly, both the two dopants emit light so that it is possible to maintain the same color, and furthermore to improve the lifespan of luminescence in the organic emitting layer.

In an energy level point of view, a small difference of T1 energy between the first dopant and the second dopant may cause a small difference of maximum intrinsic luminescence wavelength therebetween. For example, if T1 energy level of the first dopant is 2.6 eV, the maximum intrinsic luminescence wavelength is 516 nm, which shows a green wavelength region. If T1 energy level of the second dopant is 2.4 eV, the maximum intrinsic luminescence wavelength is 538 nm, which shows a green wavelength region, and thus both the first dopant and the second dopant emit the light of the same color region.

Meanwhile, a large difference of T1 energy between the first dopant and the second dopant may cause a large difference of maximum intrinsic luminescence wavelength therebetween. For example, if T1 energy level of the first dopant is 2.4 eV, the maximum intrinsic luminescence wavelength is 538 nm, which shows a green wavelength region. If T1 energy level of the second dopant is 2.0 eV, the maximum intrinsic luminescence wavelength is 615 nm, which shows a red wavelength region. Thus, if applying the two dopants with T1 energy difference of 0.4 eV, the luminescence is made by induction of energy transfer to the long-wavelength dopant. That is, the red luminescence occurs so that it is difficult to realize the luminescence in the desired color region.

Accordingly, if a difference of T1 energy between the first dopant and the second dopant is 0.01 eV or more, and is 0.2 eV or less, the energy transfer may be dividedly induced to the first dopant and the second dopant from the host. Thus, the energy transfer stress is divided and applied to each of the first dopant and the second dopant, thereby improving the luminescence-span of organic light emitting device.

FIG. 5 shows electro-optical characteristics evaluation results in accordance with the condition of single dopant and mixed dopant in the organic light emitting device according to the embodiment of the present invention. A structure of the organic light emitting device with only green emitting layer for the electro-optical characteristics evaluation in accordance with the condition of single dopant and mixed dopant will be shown as follows.

A first electrode 110 is formed of a reflective electrode including argentum (Ag), and a hole injection layer 120 is formed of HATCN at 100 Å thickness, wherein the hole injection layer 120 is provided on the first electrode 110. After forming a first hole transporting layer 130 of NPD at 1100 Å thickness, a third hole transporting layer 132 is formed of TPD at 150 Å thickness.

In order to form an organic emitting layer on the third hole transporting layer 132, an emitting layer of 400 Å thickness is formed by the use of a host material of CBP. Thereafter, the host is doped with first dopant and second dopant under the following conditions of comparative examples 1 and 2 and embodiments 1, 2 and 3, to thereby form a green emitting layer 150.

The first dopant and second dopant may be formed of a phosphorescent material with Ir complex material including Ir(ppy)3(fac tris(2-phenylpyridine)iridium), or may be formed of a fluorescent material with Alq3(tris(8-hydroxyquinolino)aluminum), but not limited to these materials. The first dopant and the second dopant have the different maximum intrinsic luminescence wavelengths, and a difference of maximum intrinsic luminescence wavelength between the first dopant and the second dopant is larger than 0 nm, and is 25 nm or lower than 25 nm.

In case of the comparative example 1, the host of CBP is doped with 10% of the first dopant, to thereby form the green emitting layer 150. In case of the comparative example 2, the host of CBP is doped with 10% of the second dopant, to thereby form the green emitting layer 150.

In case of the embodiment 1, the host of CBP, which is the same as that of the above comparative examples 1 and 2, is formed at 400 Å thickness, and then the first dopant and the second dopant are mixed at a ratio of 1 to 1. Thereafter, the host is doped with 10% of the mixed dopant, to thereby form the green emitting layer 150.

In case of the embodiment 2, the host of CBP, which is the same as that of the above comparative examples 1 and 2, is formed at 400 Å thickness, and then the first dopant and the second dopant are mixed at a ratio of 3 to 2. Thereafter, the host is doped with 10% of the mixed dopant, to thereby form the green emitting layer 150.

In case of the embodiment 3, the host of CBP, which is the same as that of the above comparative examples 1 and 2, is formed at 400 Å thickness, and then the first dopant and the second dopant are mixed at a ratio of 4 to 1. Thereafter, the host is doped with 10% of the mixed dopant, to thereby form the green emitting layer 150.

Then, an electron transporting layer 170 is provided on the green emitting layer 150 formed for the comparative examples 1 and 2 and the embodiments 1, 2 and 3, wherein the electron transporting layer 170 is formed of Alq3 at 360 Å thickness. After that, an electron injection layer 180 is formed of LiF at 10 Å thickness.

A second electrode 190 is provided on the electron injection layer 180, wherein the second electrode 190 is formed of a semi-transmissive electrode (transflective electrode) at 140 Å thickness, and the second electrode 190 is formed of magnesium/argentum (Mg:Ag) at a ratio of 9 to 1.

A capping layer 200 is provided on the second electrode 190, wherein the capping layer 200 is formed of NPD at 650 Å thickness.

FIG. 5 shows the electro-optical characteristics evaluation results of driving voltage (V), driving current density (mA/cm2), emitting efficiency (cd/A), luminance (cd/m2), power efficiency (lm/W), chromaticity coordinates (x, g), and external quantum efficiency (EQE(%)) for the organic light emitting device. As shown in FIG. 5, the electro-optical characteristics of the embodiments 1, 2 and 3 is scarcely different from that of the comparative examples 1 and 2.

In case of the external quantum efficiency (EQE(%)), the comparative example 1 is 32%, the comparative example 2 is 29.7%, the embodiment 1 is 31.5%, the embodiment 2 is 29.5%, and the embodiment 3 is 29.2%. Accordingly, the external quantum efficiency (EQE(%)) of the embodiments 1, 2 and 3 is scarcely different from that of the comparative examples 1 and 2.

Also, the measured emitting efficiency and luminance of the embodiments 1, 2 and 3 is scarcely different from that of the comparative examples 1 and 2. As a result, there is no large difference of the electro-optical characteristics between the embodiments and the comparative examples. The electro-optical characteristics under the condition of mixed dopant application are similar to the electro-optical characteristics under the condition of single dopant application, whereby it shows that the mixed dopant is applicable to a virtual organic light emitting display panel.

In case of a margin of the chromaticity coordinates needed for applying the organic light emitting device to the organic light emitting panel, 'CIE x' of red luminescence is 0.670~0.678, 'CIE x' of green luminescence is 0.210~0.260, and 'CIE y' of blue luminescence is 0.045~0.060.

In case of 'CIE x' of FIG. 5, the comparative example 1 is 0.196, the comparative example 2 is 0.265, the embodiment 1 is 0.261, the embodiment 2 is 0.250, and the embodiment 3 is 0.234. The results of the comparative examples and the embodiments are within a range satisfying the margin of the chromaticity coordinates on the green luminescence appropriate for the organic light emitting device.

This result shows that the green maximum luminescence wavelength of the organic light emitting device formed by the doping method using the mixed dopant of first dopant and second dopant is included in the region of the green maximum luminescence wavelength of the organic light emitting device formed by the doping method using only the first dopant of the comparative example 1 or only the second dopant of the comparative example 2. In the same as colors of the organic light emitting device using the single dopant of each of the first dopant and the second dopant, colors of the organic light emitting device with the green emitting layer obtained by the mixed dopant of the first dopant and second dopant as shown in the embodiments 1, 2 and 3 are satisfiable for colors needed for the organic light emitting panel.

Figure 6:
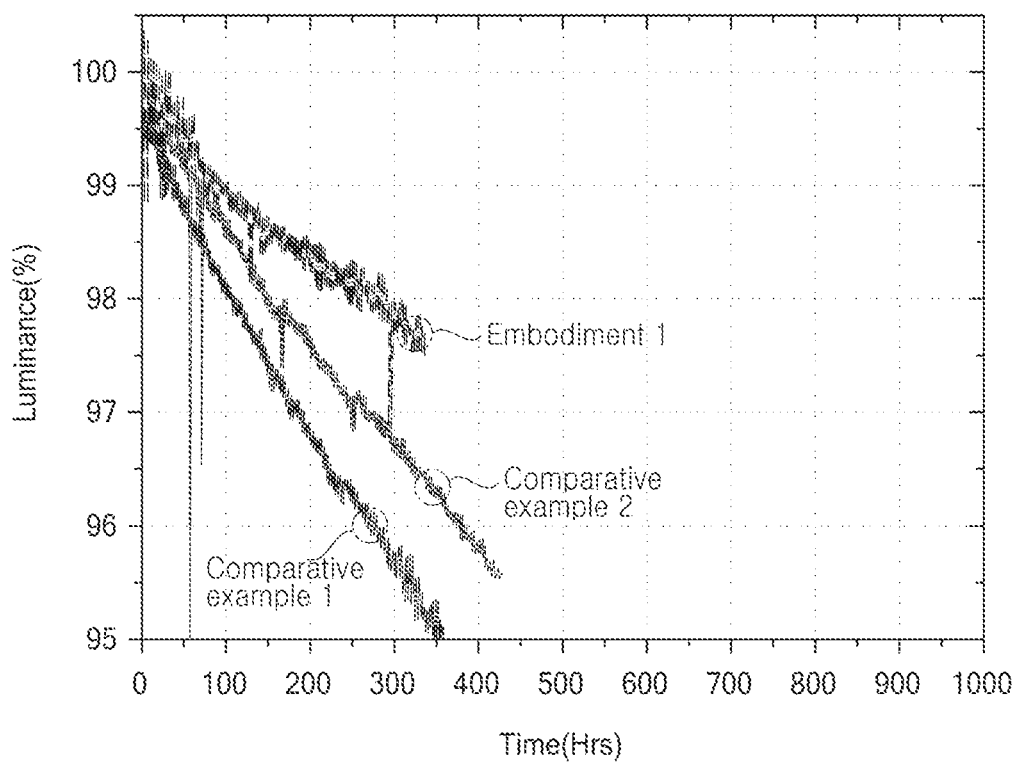
FIGS. 6, 7 and 8 illustrate test results for lifespan evaluation in accordance with changes in mixing conditions of dopants included in the organic light emitting device according to the embodiment of the present invention.
Figure 7:
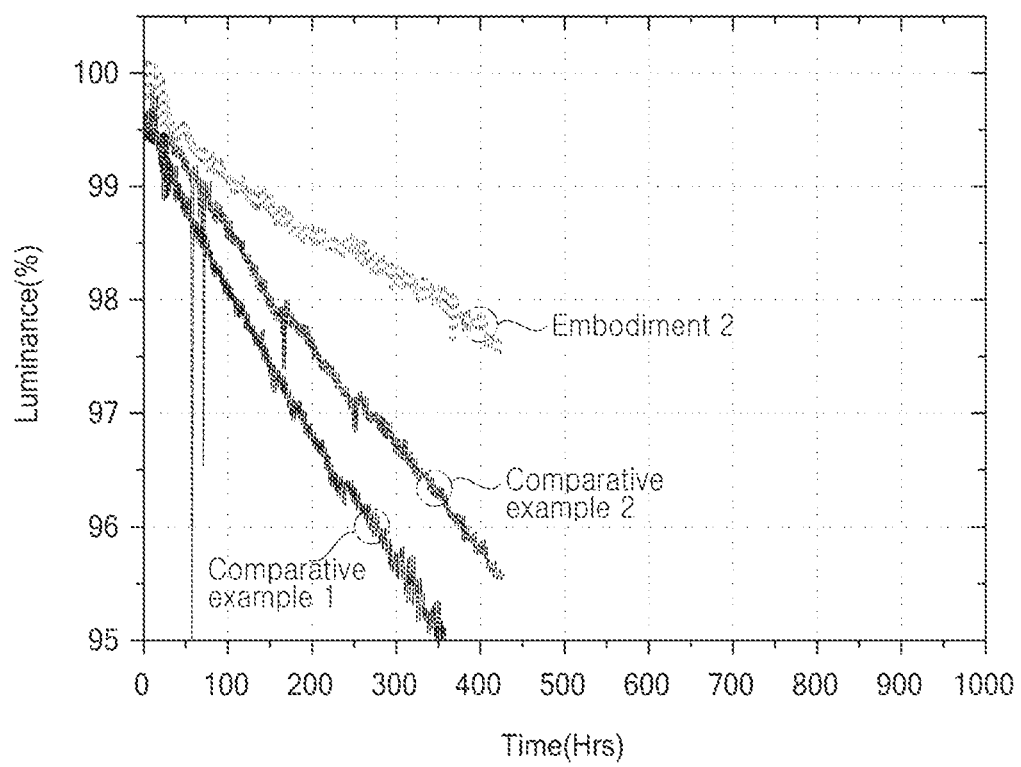
Figure 8:
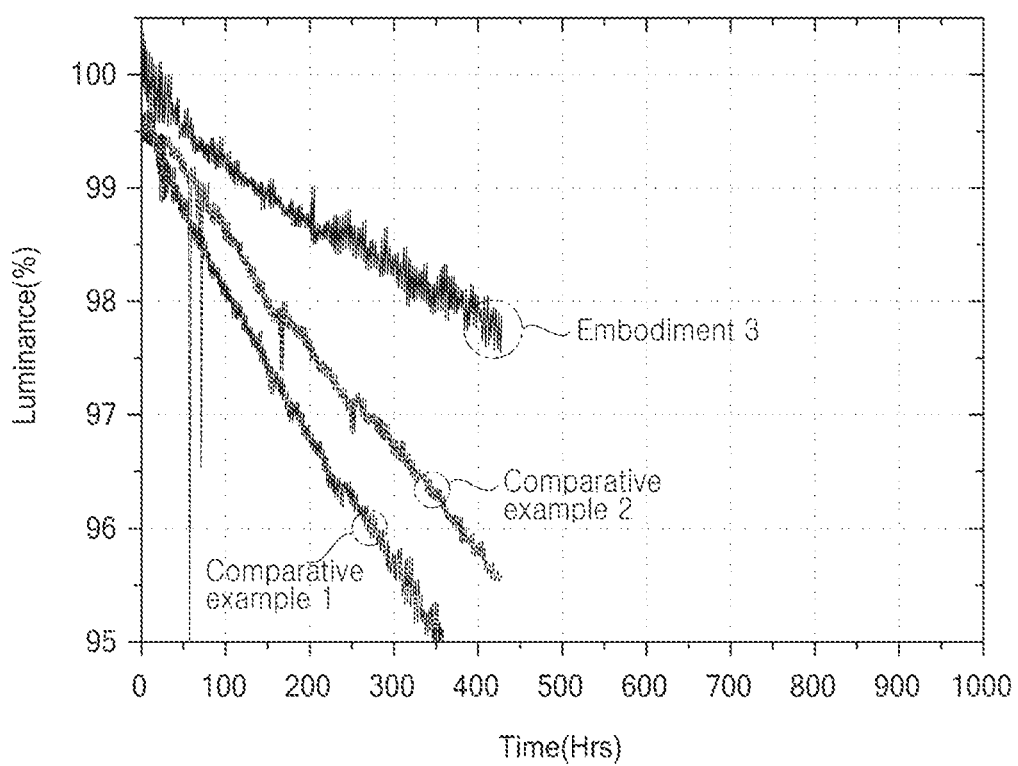

FIGS. 6, 7 and 8 illustrate test results for lifespan evaluation in accordance with changing the mixing conditions of a dopant included in the organic light emitting device according to the embodiment of the present invention. A structure of the organic light emitting device for the test for lifespan evaluation will be shown as follows.

A first electrode 110 is formed of a reflective electrode including argentum (Ag), and a hole injection layer 120 is formed of HATCN at 100 Å thickness, wherein the hole injection layer 120 is provided on the first electrode 110. Then, a first hole transporting layer 130 is formed of NPD at 1100 Å thickness.

Thereafter, a third hole transporting layer 132 is provided on the first hole transporting layer 130, and is formed of TPD at 150 Å thickness, and then a green emitting layer 150 is provided on the third hole transporting layer 132. The green emitting layer 150 is formed of a host using a mixture of Anthracene and CBP (or mCP or CBP), and a dopant is formed of a phosphorescent material with Ir complex including Ir(ppy)3(fac tris(2-phenylpyridine)iridium). The host is formed at 400 Å thickness, and the host is doped with 10% of dopant, to thereby form the green emitting layer 150.

For the following comparative examples 1 and 2 and the embodiments 1, 2 and 3, the host is doped with the dopant under the different conditions of the first dopant and the second dopant, to thereby form the green emitting layer 150. The maximum intrinsic luminescence wavelength of first dopant is different from the maximum intrinsic luminescence wavelength of second dopant, wherein a difference of maximum intrinsic luminescence wavelength between the first dopant and the second dopant is larger than 0 nm, and is 25 nm or lower than 25 nm.

In case of the comparative example 1, the host of CBP is formed at 400 Å thickness, and the host is doped with 10% of the first dopant, to thereby form the green emitting layer 150.

In case of the comparative example 2, the host of CBP is formed at 400 Å thickness, and the host is doped with 10% of the second dopant, to thereby form the green emitting layer 150.

In case of the embodiment 1, the host of CBP, which is the same as that of the above comparative examples 1 and 2, is formed at 400 Å thickness, and then the first dopant and the second dopant are mixed at a ratio of 1 to 1. Thereafter, the host is doped with 10% of the mixed dopant, to thereby form the green emitting layer 150.

In case of the embodiment 2, the host of CBP, which is the same as that of the above comparative examples 1 and 2, is formed at 400 Å thickness, and then the first dopant and the second dopant are mixed at a ratio of 3 to 2. Thereafter, the host is doped with 10% of the mixed dopant, to thereby form the green emitting layer 150.

In case of the embodiment 3, the host of CBP, which is the same as that of the above comparative examples 1 and 2, is formed at 400 Å thickness, and then the first dopant and the second dopant are mixed at a ratio of 4 to 1. Thereafter, the host is doped with 10% of the mixed dopant, to thereby form the green emitting layer 150.

Then, an electron transporting layer 170 is provided on the green emitting layer 150 formed by the comparative examples 1 and 2 and the embodiments 1, 2 and 3, wherein the electron transporting layer 170 is formed of Alq3 at 360 Å thickness. After that, an electron injection layer 180 is formed of LiF at 10 Å thickness.

A second electrode 190 is provided on the electron injection layer 180, wherein the second electrode 190 is formed of a semi-transmissive electrode (transflective electrode) at 140 Å thickness, and the second electrode 190 is formed by the use of magnesium/argentum (Mg:Ag) at a ratio of 9 to 1. Then, a capping layer 200 is provided on the second electrode 190, wherein the capping layer 200 is formed of NPD at 650 Å thickness.

By providing the organic light emitting device satisfying the above condition, the lifespan of organic light emitting device is measured, and the results are compared as follows.

As shown in FIG. 6, in comparison to the comparative example 1 for the green emitting layer 150 doped with 10% of only the first dopant, and the comparative example 2 for the green emitting layer 150 doped with 10% of only the second dopant, the embodiment 1 for the green emitting layer 150 doped with 10% of the mixed dopant of first dopant and second dopant at a ratio of 1 to 1 shows the improved luminescence-span.

Also, as shown in FIG. 7, in comparison to the comparative examples 1 and 2, the embodiment 2 for the green emitting layer 150 doped with 10% of the mixed dopant of first dopant and second dopant at a ratio of 3 to 2 shows the improved luminescence-span.

Also, as shown in FIG. 8, in comparison to the comparative examples 1 and 2, the embodiment 3 for the green emitting layer 150 doped with 10% of the mixed dopant of first dopant and second dopant at a ratio of 4 to 1 shows the improved luminescence-span.

On the lifespan evaluation results of the embodiments 1, 2 and 3, a luminance after luminescence of 300 hours is about 98% or more in comparison to an initial luminance.

Meanwhile, in case of the lifespan evaluation results of the comparative examples 1 and 2, a luminance after luminescence of 300 hours is about 97% and 96% or less in comparison to an initial luminance.

That is, in comparison to the lifespan of organic light emitting device using the single dopant of first or second dopant, the lifespan of organic light emitting device using the mixed dopant of first dopant and second dopant is more improved.

According to the lifespan evaluation results of the embodiment 3 showing the first dopant and the second dopant mixed at a ratio of 4 to 1 in FIG. 8, the embodiment 2 showing the first dopant and the second dopant mixed at a ratio of 3 to 2 in FIG. 7, and the embodiment 1 showing the first dopant and the second dopant mixed at a ratio of 1 to 1 in FIG. 6, the lifespan of the organic light emitting device in accordance with the embodiment 3 is longer than the lifespan of the organic light emitting device in accordance with the embodiments 1 and 2.

That is, on the condition of the mixed dopant of first dopant and second dopant, if a doping concentration of the first dopant is higher than a doping concentration of the second dopant, the lifespan of the organic light emitting device is improved.

When the two dopants with the different maximum intrinsic luminescence wavelengths are applied to one organic emitting layer, wherein a difference of maximum intrinsic luminescence wavelength between the two dopants is larger than 0 nm, and is 25 nm or lower than 25 nm, the energy transfer is dividedly induced to the first dopant and the second dopant for the luminescence of first dopant and second dopant, to thereby improve the lifespan of the organic light emitting device.

Figure 9:
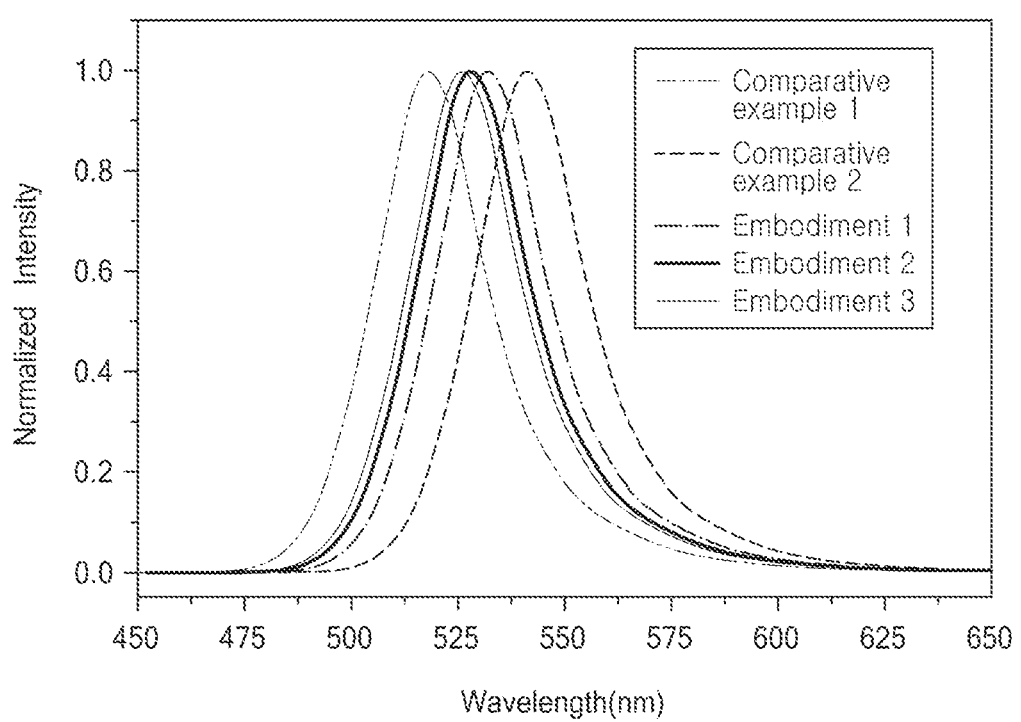
FIG. 9 shows test results of maximum luminescence wavelength of the organic light emitting device according to the embodiment of the present invention.

FIG. 9 shows test results of the maximum luminescence wavelength of the organic light emitting device according to the embodiment of the present invention.

Herein, an EL (Electro Luminescence) wavelength for the organic light emitting device is measured under the condition of each of the comparative examples 1 and 2 and the embodiments 1, 2 and 3. The EL wavelength is obtained by analyzing a spectrum of light emitted from the organic light emitting device.

As shown in FIG. 9, the EL max wavelength of each of the embodiment 1 using the mixed dopant of first dopant and second dopant at a ratio of 1 to 1, the embodiment 2 using the mixed dopant of first dopant and second dopant at a ratio of 3 to 2 and the embodiment 3 using the mixed dopant of first dopant and second dopant at a ratio of 4 to 1 is included in a range of the EL max wavelength of the comparative example 1 using only the first dopant and the comparative example 2 using only the second dopant.

The results of the EL max wavelengths in the comparative examples 1 and 2 and the embodiments 1, 2 and 3 in accordance with the EL wavelength test of the organic light emitting device shown in FIG. 9 are shown in the following Table 2.

TABLE 2

| | Structure | EL max wavelength (nm) |
|---|---|---|
| Comparative example 1 | Doped with 10% of first dopant (single dopant) | 517 |
| Comparative example 2 | Doped with 10% of second dopant (single dopant) | 542 |
| Embodiment 1 | Doped with 10% of mixed dopant of first dopant and second dopant at a ratio of 1 to 1 (mixed dopant) | 532 |
| Embodiment 2 | Doped with 10% of mixed dopant of first dopant and second dopant at a ratio of 3 to 2 (mixed dopant) | 528 |
| Embodiment 3 | Doped with 10% of mixed dopant of first dopant and second dopant at a ratio of 4 to 1 (mixed dopant) | 526 |

In the above Table 2, 532 nm corresponding to the EL max wavelength of the embodiment 1, 528 nm corresponding to the EL max wavelength of the embodiment 2, and 526 nm corresponding to the EL max wavelength of the embodiment 3 are between 517 nm corresponding to the EL max wavelength of the comparative example 1 and 542 nm corresponding to the EL max wavelength of the comparative example 2.

That is, on the assumption that the organic light emitting device has the same structure and the same thickness, if the dopant condition is changed in accordance with the mixing ratio of first dopant and second dopant, as shown in the embodiments 1, 2 and 3, the EL max wavelengths of the embodiments 1, 2 and 3 are within a range of the EL max wavelengths of the comparative examples 1 and 2 using the single dopant. Thus, it is possible to satisfy a desired color region in the organic light emitting device.

If the plurality of dopants are mixed together, and are then applied to one organic emitting layer of the organic light emitting device according to the embodiment of the present invention, wherein the plurality of dopants have the different maximum intrinsic luminescence wavelengths and the difference of maximum intrinsic luminescence wavelength between each of the dopants is larger than 0 nm, and is 25 nm or lower than 25 nm, it is possible to improve the lifespan of the organic light emitting device.

Also, the maximum luminescence wavelengths of the organic light emitting device using the mixed dopant are included in the range of the maximum luminescence wavelengths of the organic light emitting device using the single dopant so that it is possible to satisfy the desired color region.

Although not shown, if forming the first electrode 110 of a transmitting electrode whose transmittance is 80% or more, and forming the second electrode 190 of a reflective electrode, it is possible to improve a lifespan of a bottom-emission type organic light emitting device which is not formed in a micro-cavity structure.

Although not shown in the above description for the embodiment of the present invention, the plurality of dopants with the different maximum intrinsic luminescence wavelengths may be applied to the blue emitting layer or red emitting layer in the same manner as the green emitting layer, to thereby improve the lifespan of the organic light emitting device.

In addition, it is possible to apply the plurality of dopants with the different maximum intrinsic luminescence wavelengths to the red and green emitting layers, the red and blue emitting layers, the green and blue emitting layers, or the red, green and blue emitting layers, to thereby improve the lifespan of the organic light emitting device.

The difference of maximum intrinsic luminescence wavelength between each of the dopants may be larger than 0 nm, and may be 25 nm or lower than 25 nm.

The plurality of dopants may be comprised of the phosphorescence material.

The plurality of dopants may be the first dopant and the second dopant included in the green emitting layer, wherein the maximum intrinsic luminescence wavelength of the first dopant may be smaller than the maximum intrinsic luminescence wavelength of the second dopant.

The plurality of dopants may be the first dopant and the second dopant included in the red emitting layer, wherein the maximum intrinsic luminescence wavelength of the first dopant may be smaller than the maximum intrinsic luminescence wavelength of the second dopant.

The plurality of dopants may be the first dopant and the second dopant included in the blue emitting layer, wherein the maximum intrinsic luminescence wavelength of the first dopant may be smaller than the maximum intrinsic luminescence wavelength of the second dopant.

The maximum luminescence wavelength of the organic emitting layer including the plurality of dopants may be larger than the maximum intrinsic luminescence wavelength of the first dopant or may be smaller than the maximum intrinsic luminescence wavelength of the second dopant.

The doping concentration of the first dopant may be the same as or higher than the doping concentration of the second dopant.

A difference of triplet energy level between the first dopant and the second dopant may be the same as 0.01 ev or larger than 0.01 ev, and may be the same as 0.2 eV or smaller than 0.2 eV.

The first electrode may be the reflective electrode, and the second electrode may be the transflective electrode.

The first electrode may be the transmitting electrode, and the second electrode may be the reflective electrode.

The first dopant and second dopant may be included in the green emitting layer.

The first dopant and second dopant may be included in the red emitting layer.

The first dopant and second dopant may be included in the blue emitting layer.

According to the present invention, the plurality of dopants are applied to at least one emitting layer so that it is possible to reduce a degradation stress for the luminescence, to thereby improve the lifespan of the organic emitting layer.

Also, a resonance of light is amplified by a constructive interference through the micro-cavity structure, whereby light is emitted narrowly, thereby improving reliability of the organic light emitting device.

Also, the maximum luminescence wavelength of the organic emitting layer including the plurality of dopants has the values within the range of the maximum intrinsic luminescence wavelength for each of the dopants, to thereby satisfy the desired color region.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
   an organic emitting layer including red, green and blue emitting layers, the organic emitting layer provided between first and second electrodes; and
   a plurality of dopants included in at least any one of the red, green and blue emitting layers,
   wherein a maximum intrinsic luminescence wavelength of any one dopant among the plurality of dopants is different from a maximum intrinsic luminescence wavelength of another dopant among the plurality of dopants,
   wherein the plurality of dopants include a first dopant and a second dopant in the green emitting layer, in the red emitting layer, in the blue emitting layer, or in any combination of the emitting layers,
   wherein a maximum intrinsic luminescence wavelength of the first dopant is smaller than a maximum intrinsic luminescence wavelength of the second dopant, and
   wherein a difference of triplet energy level between the first dopant and the second dopant is equal to or larger than 0.01 eV, but smaller than or equal to 0.2 eV.

2. The organic light emitting device according to claim 1, wherein a difference of maximum intrinsic luminescence wavelength between each of the dopants is larger than 0 nm, but smaller than or equal to 25 nm.

3. The organic light emitting device according to claim 2, wherein the plurality of dopants are formed of a phosphorescent material.

4. The organic light emitting device according to claim 1, wherein a maximum luminescence wavelength of the organic emitting layer including the plurality of dopants is larger than the maximum intrinsic luminescence wavelength of the first dopant, and is smaller than the maximum intrinsic luminescence wavelength of the second dopant.

5. The organic light emitting device according to claim 1, wherein a doping concentration of the first dopant is the same as or higher than a doping concentration of the second dopant.

6. The organic light emitting device according to claim 1, wherein the first electrode is a reflective electrode, and the second electrode is a transflective electrode.

7. The organic light emitting device according to claim 1, wherein the first electrode is a transmitting electrode, and the second electrode is a reflective electrode.

8. An organic light emitting device comprising:
   an organic emitting layer including red, green and blue emitting layers, the organic emitting layer provided between first and second electrodes,
   wherein the organic emitting layer includes a first dopant and a second dopant,
   wherein a maximum intrinsic luminescence wavelength of the first dopant is different from a maximum intrinsic luminescence wavelength of the second dopant so as to divide an energy transfer to the first dopant and the second dopant in order to achieve luminescence of the organic emitting layer, and
   wherein a maximum luminescence wavelength of the organic emitting layer including the first dopant and the second dopant is larger than the maximum intrinsic luminescence wavelength of the first dopant, and is smaller than the maximum intrinsic luminescence wavelength of the second dopant.

9. The organic light emitting device according to claim 8, wherein the first dopant and the second dopant are included in the red emitting layer, in the green emitting layer, in the blue emitting layer, or in any combination of the emitting layers.

10. The organic light emitting device according to claim 9, wherein a difference of maximum intrinsic luminescence wavelength between the first dopant and the second dopant is larger than 0nm, but smaller than or equal to 25 nm.

11. The organic light emitting device according to claim 9, wherein the first dopant and the second dopant are formed of a phosphorescent material.

12. The organic light emitting device according to claim 9, wherein a difference of triplet energy level between the first dopant and the second dopant is equal to or larger than 0.01 eV, but smaller than or equal to 0.2 eV.

13. The organic light emitting device according to claim 9, wherein a doping concentration of the first dopant is the same as or higher than a doping concentration of the second dopant.

14. An organic light emitting device comprising:
an organic emitting layer between first and second electrodes; and
a plurality of dopants in the organic emitting layer, the plurality of dopants including a first dopant and a second dopant,
wherein a maximum intrinsic luminescence wavelength of the first dopant is smaller than a maximum intrinsic luminescence wavelength of the second dopant, and
wherein an energy transfer is divided into the first dopant and the second dopant when the organic emitting layer emits light, and both of the first dopant and the second dopant emit the light having the same color.

15. The organic light emitting device according to claim 14, wherein a difference of triplet energy level between the first dopant and the second dopant is equal to or larger than 0.01 eV, and smaller than or equal to 0.2 eV.

16. The organic light emitting device according to claim 14, wherein a difference of maximum intrinsic luminescence wavelength between the first dopant and the second dopant is larger than 0 nm, and smaller than or equal to 25 nm.

17. The organic light emitting device according to claim 14, wherein a maximum luminescence wavelength of the organic emitting layer including the plurality of dopants is larger than the maximum intrinsic luminescence wavelength of the first dopant, and is smaller than the maximum intrinsic luminescence wavelength of the second dopant.

18. The organic light emitting device according to claim 14, wherein a doping concentration of the first dopant is the same as or higher than a doping concentration of the second dopant.

* * * * *